United States Patent
Choi

(10) Patent No.: US 8,149,015 B2
(45) Date of Patent: Apr. 3, 2012

(54) TRANSCEIVER SYSTEM, SEMICONDUCTOR DEVICE THEREOF, AND DATA TRANSCEIVING METHOD OF THE SAME

(75) Inventor: Seok-Woo Choi, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/834,299

(22) Filed: Jul. 12, 2010

(65) Prior Publication Data

US 2011/0057684 A1    Mar. 10, 2011

(30) Foreign Application Priority Data

Sep. 10, 2009  (KR) .................. 10-2009-0085456

(51) Int. Cl.
*H03K 17/16* (2006.01)
*H03K 19/003* (2006.01)

(52) U.S. Cl. .............. 326/30; 326/86; 327/109

(58) Field of Classification Search .............. 326/30, 326/56–58, 82–83, 86–87; 327/108–109, 327/112

See application file for complete search history.

(56) References Cited

U.S. PATENT DOCUMENTS

| | | | | |
|---|---|---|---|---|
| 5,781,028 A * | 7/1998 | Decuir | | 326/30 |
| 6,411,122 B1 * | 6/2002 | Mughal et al. | | 326/30 |
| 6,625,206 B1 * | 9/2003 | Doblar | | 375/219 |
| 6,963,218 B1 * | 11/2005 | Alexander et al. | | 326/30 |
| 6,972,597 B2 * | 12/2005 | Kim | | 326/86 |
| 7,260,057 B2 * | 8/2007 | Toyoshima et al. | | 370/211 |
| 7,792,196 B2 * | 9/2010 | Sheiman et al. | | 375/257 |
| 7,894,275 B2 * | 2/2011 | Choi et al. | | 365/189.05 |
| 7,902,858 B2 * | 3/2011 | Kuwahara et al. | | 326/30 |
| 2003/0001618 A1 * | 1/2003 | Haycock et al. | | 326/82 |
| 2003/0080774 A1 * | 5/2003 | Funaba | | 326/30 |
| 2003/0117172 A1 * | 6/2003 | Wu et al. | | 326/83 |
| 2007/0285121 A1 | 12/2007 | Park et al. | | |
| 2008/0061818 A1 * | 3/2008 | Santurkar et al. | | 326/30 |

FOREIGN PATENT DOCUMENTS

| | | |
|---|---|---|
| JP | 2006-025150 | 1/2006 |
| JP | 2007-306569 | 11/2007 |
| KR | 1020060066804 | 6/2006 |
| KR | 1020070109189 | 11/2007 |

* cited by examiner

*Primary Examiner* — Jason M Crawford
(74) *Attorney, Agent, or Firm* — F. Chau & Associates, LLC

(57) ABSTRACT

A transceiver system includes a first semiconductor device having a first input/output (I/O) pad connected with an I/O channel and a second semiconductor device having a second I/O pad connected with the I/O channel. The first semiconductor device is configured to terminate the first I/O pad with a first voltage when data is received, and maintain the first I/O pad and the I/O channel at the first voltage when data is transmitted. The second semiconductor device is configured to terminate the second I/O pad with a second voltage higher than the first voltage when data is received, and maintain the second I/O pad and the I/O channel at the second voltage when data is transmitted.

21 Claims, 5 Drawing Sheets

TRANSCEIVER SYSTEM, SEMICONDUCTOR DEVICE THEREOF, AND DATA TRANSCEIVING METHOD OF THE SAME

CROSS-REFERENCE TO RELATED APPLICATION

This application claims priority under 35 U.S.C. §119 to Korean Patent Application No. 10-2009-85456, filed on Sep. 10, 2009, the disclosure of which is incorporated by reference in its entirety herein.

BACKGROUND

1. Technical Field

Exemplary embodiments of the inventive concept relate to a transceiver system, and more particularly, to a semiconductor device having an input/output (I/O) circuit capable of transceiving data, a transceiver system having the semiconductor device, and a data transceiving method of the transceiver system.

2. Discussion of Related Art

A semiconductor device can transceive signals with another semiconductor device through a channel. The semiconductor device may include an I/O circuit connected with the channel to transceive the signals. The I/O circuit may be used to transmit signals through a channel and receive signals through the channel to restore signals.

The I/O circuit may include a termination resistor to minimize signal reflection and improve signal integrity. However, when the I/O circuit includes the termination resistor, an input capacitance component may be present. Such an input capacitance component may limit high-speed operation of a multi-stack package semiconductor device in which a plurality of semiconductor chips are stacked to improve the degree of integration.

SUMMARY

According to an exemplary embodiment of the inventive concept a transceiver system includes a first semiconductor device having a first input/output (I/O) pad connected with an I/O channel and a second semiconductor device having a second I/O pad connected with the I/O channel. The first semiconductor device is configured to terminate the first I/O pad with a first voltage when data is received, and drive the I/O channel based on data to be transmitted when data is transmitted. The second semiconductor device is configured to terminate the second I/O pad with a second voltage higher than the first voltage when data is received, and drive the I/O channel based on data to be transmitted when data is transmitted.

The first semiconductor device may be configured to compare a first reference voltage higher than the first voltage with a voltage of the first I/O pad, and the second semiconductor device may be configured to compare a second reference voltage higher than the first voltage and lower than the second voltage with a voltage of the second I/O pad.

The first semiconductor device may include a first terminator/driver and a first input unit. The first terminator/driver may be connected between the first I/O pad and the first voltage, and configured to terminate the first I/O pad with the first voltage when the first semiconductor device receives data, and maintain the first I/O pad and the I/O channel at the first voltage when the first semiconductor device transmits data. The first input unit may be configured to compare the first reference voltage with the voltage of the first I/O pad and output a first input signal when the first semiconductor device receives data.

The second semiconductor device may include a second terminator/driver and a second input unit. The second terminator/driver may be connected between the second I/O pad and the second voltage, and configured to terminate the second I/O pad with the second voltage when the second semiconductor device receives data, and drive the second I/O pad and the I/O channel using the second voltage when the second semiconductor device transmits data. The second input unit may be configured to compare the second reference voltage with the voltage of the second I/O pad and output a second input signal when the second semiconductor device receives data.

The first semiconductor device may further include a memory cell and a decoder/selector. The memory cell array may be configured to receive and store the first input signal during a write operation, and output an output signal during a read operation. The decoder/selector may be configured to output a control signal of a high level in response to an externally input command signal during the read operation, and output the control signal in response to the output signal during the write operation. The first terminator/driver may terminate the first I/O pad with the first voltage in response to the control signal during the read operation and drive the first I/O pad and the I/O channel in response to the control signal during the write operation. The first semiconductor device may be a semiconductor memory device and the second semiconductor device may be a memory controller that outputs the command signal.

The first terminator/driver of the first semiconductor device may include an n-type metal oxide semiconductor (NMOS) transistor and a pull-down resistor connected between the NMOS transistor and the first I/O pad. The NMOS transistor may be connected with the first voltage and have a gate to which the control signal is applied.

The decoder/selector of the first semiconductor device may output the control signal of a low level in response to the command signal during a refresh operation, and the first terminator/driver may set the first I/O pad to a high-impedance state in response to the control signal during the refresh operation.

The second semiconductor device may further include a memory cell array and decoder/selector. The memory cell array may be configured to receive and store the second input signal during a write operation, and output an output signal during a read operation. The decoder/selector may be configured to output a control signal of a low level in response to an externally input command signal during the read operation, and output the control signal in response to the output signal during the write operation. The second terminator/driver may terminate the second I/O pad with the second voltage in response to the control signal during the read operation and drive the second I/O pad and the I/O channel in response to the control signal during the write operation. The second semiconductor device may be a semiconductor memory device and the first semiconductor device may be a memory controller that outputs the command signal.

The second terminator/driver of the second semiconductor device may include a p-type metal oxide semiconductor (PMOS) transistor and a pull-up resistor connected between the PMOS transistor and the second I/O pad. The PMOS transistor may be connected with the second voltage and have a gate to which the control signal is applied.

The decoder/selector of the second semiconductor device may output the control signal of a high level in response to the command signal during a refresh operation, and the second terminator/driver may set the second I/O pad to a high-impedance state in response to the control signal during the refresh operation.

According to an exemplary embodiment of the inventive concept, a semiconductor device includes an I/O pad connected with an I/O channel, a terminator/driver connected between the I/O pad and a ground voltage, and an input unit. The terminator/driver is configured to terminate the I/O pad with the ground voltage when data is received. The input unit is configured to compare a voltage of the I/O pad with a reference voltage higher than the ground voltage and output an input signal when data is received. The terminator/driver may drive the I/O channel using the ground voltage when data is transmitted.

The semiconductor device may be a semiconductor memory device further including a memory cell array and a decoder/selector. The memory cell array may be configured to receive and store the input signal during a write operation, and output an output signal during a read operation. The decoder/selector may be configured to output a control signal of a high level in response to an externally input command signal during the read operation, output the control signal of a low level during a refresh operation, and output the control signal in response to the output signal during the write operation. The terminator/driver may include a NMOS transistor connected with the ground voltage and to which the control signal is applied and a pull-down resistor connected between the NMOS transistor and the I/O pad.

According to an exemplary embodiment of the inventive concept, a semiconductor device includes an I/O pad connected with an I/O channel, a terminator/driver connected between the I/O pad and a supply voltage, and an input unit. The terminator/driver is configured to terminate the I/O pad with the supply voltage when data is received. The input unit is configured to compare a voltage of the I/O pad with a reference voltage lower than the supply voltage and output an input signal when data is received. The terminator/driver may drive the I/O channel using the supply voltage when data is transmitted.

The semiconductor device may be a semiconductor memory device further including a memory cell array and a decoder/selector. The memory cell array may be configured to receive and store the input signal during a write operation, and output an output signal during a read operation. The decoder/selector may be configured to output a control signal of a low level in response to a command signal input from the outside during the read operation, output the control signal of a high level during a refresh operation, and output the control signal in response to the output signal during the write operation. The terminator/driver may include: a PMOS transistor connected with the supply voltage and to which the control signal is applied and a pull-up resistor connected between the PMOS transistor and the I/O pad.

According to an exemplary embodiment of the inventive concept, a data transceiving method of a semiconductor device includes a first semiconductor device having a first I/O pad connected with an I/O channel, and a second semiconductor device having a second I/O pad connected with the I/O channel. The method includes terminating, by the first semiconductor device, the first I/O pad with a first voltage when the second semiconductor device transmits data to the first semiconductor device, terminating, by the second semiconductor device, the second I/O pad with a second voltage higher than the first voltage when the first semiconductor device transmits data to the second semiconductor device, driving, by the second semiconductor device, the I/O channel using the second voltage when the second semiconductor device transmits data to the first semiconductor device, and driving, by the first semiconductor device, the I/O channel using the first voltage when the first semiconductor device transmits data to the second semiconductor device.

The data transceiving method may further include comparing, by the first semiconductor device, a first reference voltage higher than the first voltage with a voltage of the first I/O pad, generating, by the first semiconductor device, a first input signal when the second semiconductor device transmits data to the first semiconductor device, comparing, by the second semiconductor device, a second reference voltage higher than the first reference voltage and lower than the second voltage with a voltage of the second I/O pad, and generating, by the second semiconductor device, a second input signal when the first semiconductor device transmits data to the second semiconductor device.

In the data transceiving method, the first semiconductor device may be a semiconductor memory device, and the second semiconductor device may be a memory controller. Alternately, in the data transceiving method, the first semiconductor device may be a memory controller, and the second semiconductor device may be a semiconductor memory device. The data transceiving method may further include setting one of the first I/O pad or the second I/O pad to a high-impedance state.

BRIEF DESCRIPTION OF THE DRAWINGS

Exemplary embodiments of the inventive concept are described in further detail below with reference to the accompanying drawings.

DETAILED DESCRIPTION OF EXEMPLARY EMBODIMENTS

The inventive concept will now be described more fully with reference to the accompanying drawings in which some exemplary embodiments are shown. This inventive concept, however, may be embodied in many alternate forms and should not be construed as limited to only the exemplary embodiments set forth herein. Like numbers refer to like elements throughout the description of the figures. It will be understood that when an element is referred to as being "connected" or "coupled" to another element, it can be directly connected or coupled to the other element or intervening elements may be present.

Figure 1:
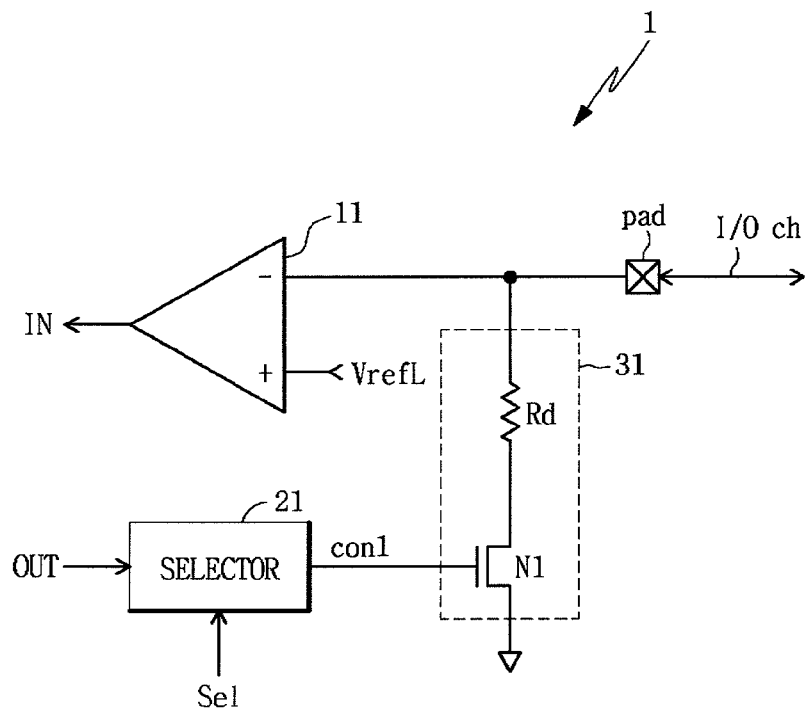
FIG. 1 illustrates a semiconductor device according to an exemplary embodiment of the inventive concept.

FIG. 1 illustrates an input/output (I/O) circuit 1 of a semiconductor device according to an exemplary embodiment of the inventive concept. The I/O circuit 1 may include an input unit 11, a selector 21, a terminator/driver 31, and an I/O pad pad. The terminator/driver 31 may include a pull-down resistor Rd and a pull-down circuit. The pull-down circuit may be an n-type metal oxide semiconductor (NMOS) transistor N1. The pull-down circuit may be connected between the I/O pad pad and a ground voltage. In FIG. 1, "I/O ch" denotes an I/O channel connected with the I/O pad pad.

The input unit 11 compares a first reference voltage VrefL and the voltage of the I/O pad pad and outputs an input signal IN when the semiconductor device having the I/O circuit 1 receives a signal. For example, the input unit 11 may include a comparator that compares the first reference voltage VrefL with the voltage of the I/O pad pad. The first reference voltage VrefL may have a higher level than the ground voltage. For example, the first reference voltage VrefL may have a level between the ground voltage and half of a supply voltage. When the I/O circuit 1 shown in FIG. 1 is connected with an I/O circuit 2 shown in FIG. 2, the first reference voltage VrefL may have a level lower than a second reference voltage VrefH and higher than the ground voltage.

The selector 21 outputs a first control signal con1 of a high level in response to a selection signal Sel when the semiconductor device having the I/O circuit 1 receives a signal, and outputs an output signal OUT as the first control signal con1 when the semiconductor device having the I/O circuit 1 transmits a signal. When the I/O pad pad needs to be set to a high-impedance state, the selector 21 may additionally output the first control signal con1 of a low level in response to the selection signal Sel.

The terminator/driver 31 terminates the I/O pad pad with a termination voltage of the ground voltage level and a termination resistance of the pull-down resistor Rd in response to the first control signal con1 of a high level when the semiconductor device having the I/O circuit 1 receives a signal.

The terminator/driver 31 drives the I/O pad pad and the I/O channel I/O ch connected with the I/O pad pad using the ground voltage in response to the first control signal con1 when the semiconductor device having the I/O circuit 1 transmits a signal. As described above, when the semiconductor device having the I/O circuit 1 transmits a signal, the selector 21 outputs the output signal OUT as the first control signal con1 in response to the selection signal sel. Thus, when the semiconductor device having the I/O circuit 1 transmits a signal and the output signal OUT is at a high level, the terminator/driver 31 drives the I/O pad pad and the I/O channel I/O ch connected with the I/O pad pad using the ground voltage, and when the output signal OUT is at a low level, the voltages of the I/O pad pad and the I/O channel I/O ch connected with the I/O pad pad are maintained. Further, the terminator/driver 31 may set the I/O pad pad to a high-impedance state in response to the first control signal con1 of a low level.

Figure 2:
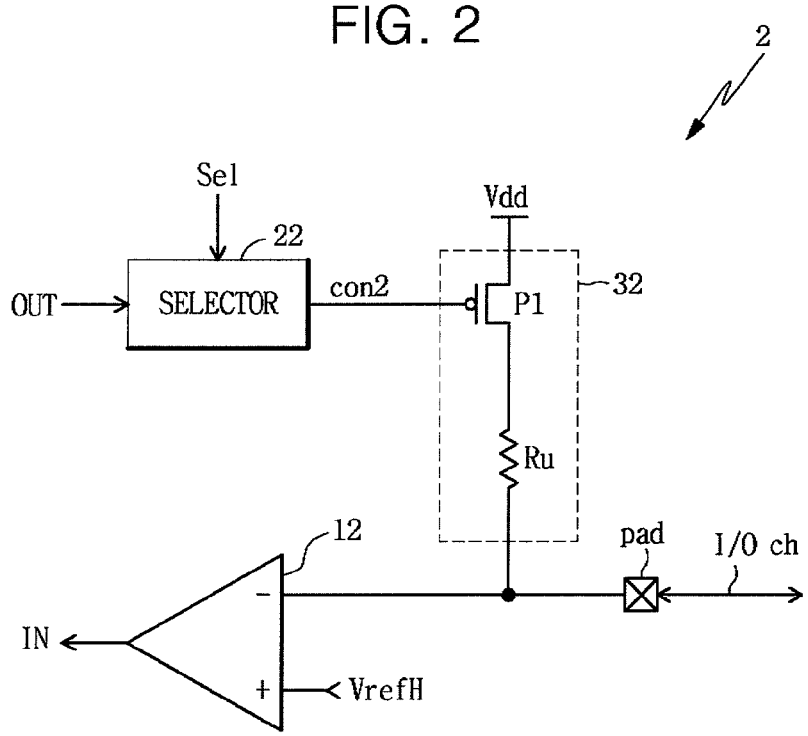
FIG. 2 illustrates a semiconductor device according to an exemplary embodiment of the inventive concept.

FIG. 2 illustrates an I/O circuit 2 of a semiconductor device according to an exemplary embodiment of the inventive concept. The I/O circuit 2 may include an input unit 12, a selector 22, a terminator/driver 32, and an I/O pad pad. The terminator/driver 32 may include a pull-up resistor Ru and a pull-up circuit. The pull-up circuit may be a p-type metal oxide semiconductor (PMOS) transistor P1. The pull-up circuit may be connected between the I/O pad pad and a supply voltage Vdd. In FIG. 2, "I/O ch" denotes an I/O channel connected with the I/O pad pad.

The input unit 12 compares the second reference voltage VrefH and the voltage of the I/O pad pad and outputs an input signal IN when the semiconductor device having the I/O circuit 2 receives a signal. For example, the input unit 12 may include a comparator that compares the second reference voltage VrefH with the voltage of the I/O pad pad. The second reference voltage VrefH may have a lower level than the supply voltage Vdd. For example, the second reference voltage VrefH may have a level between the supply voltage Vdd and a half of the supply voltage Vdd. When the I/O circuit 2 shown in FIG. 2 is connected with the I/O circuit 1 shown in FIG. 1, the second reference voltage VrefH may have a level higher than the first reference voltage VrefL and lower than the supply voltage Vdd.

The selector 22 outputs a second control signal con2 of a low level in response to a selection signal Sel when the semiconductor device having the I/O circuit 2 receives a signal, and outputs an output signal OUT as the second control signal con2 when the semiconductor device having the I/O circuit 2 transmits a signal. When the I/O pad pad needs to be set to a high-impedance state, the selector 22 may additionally output the second control signal con2 of a high level in response to the selection signal sel.

The terminator/driver 32 terminates the I/O pad pad with a termination voltage of the supply voltage Vdd and a termination resistance of the pull-up resistor Ru in response to the second control signal con2 of a low level when the semiconductor device having the I/O circuit 2 receives a signal.

The terminator/driver 32 drives the I/O pad pad and the I/O channel I/O ch connected with the I/O pad pad using the supply voltage Vdd in response to the second control signal con2 when the semiconductor device having the I/O circuit 2 transmits a signal. As described above, when the semiconductor device having the I/O circuit 2 transmits a signal, the selector 22 outputs the output signal OUT as the second control signal con2 in response to the selection signal sel. Thus, when the semiconductor device having the I/O circuit 2 transmits a signal and the output signal OUT is at a low level, the terminator/driver 32 drives the I/O pad pad and the I/O channel I/O ch connected with the I/O pad pad using the supply voltage Vdd, and when the output signal OUT is at a high level, the voltages of the I/O pad pad and the I/O channel I/O ch connected with the I/O pad pad are maintained. Further, the terminator/driver 32 may set the I/O pad pad to a high-impedance state in response to the second control signal con2 of a low level.

Figure 3:
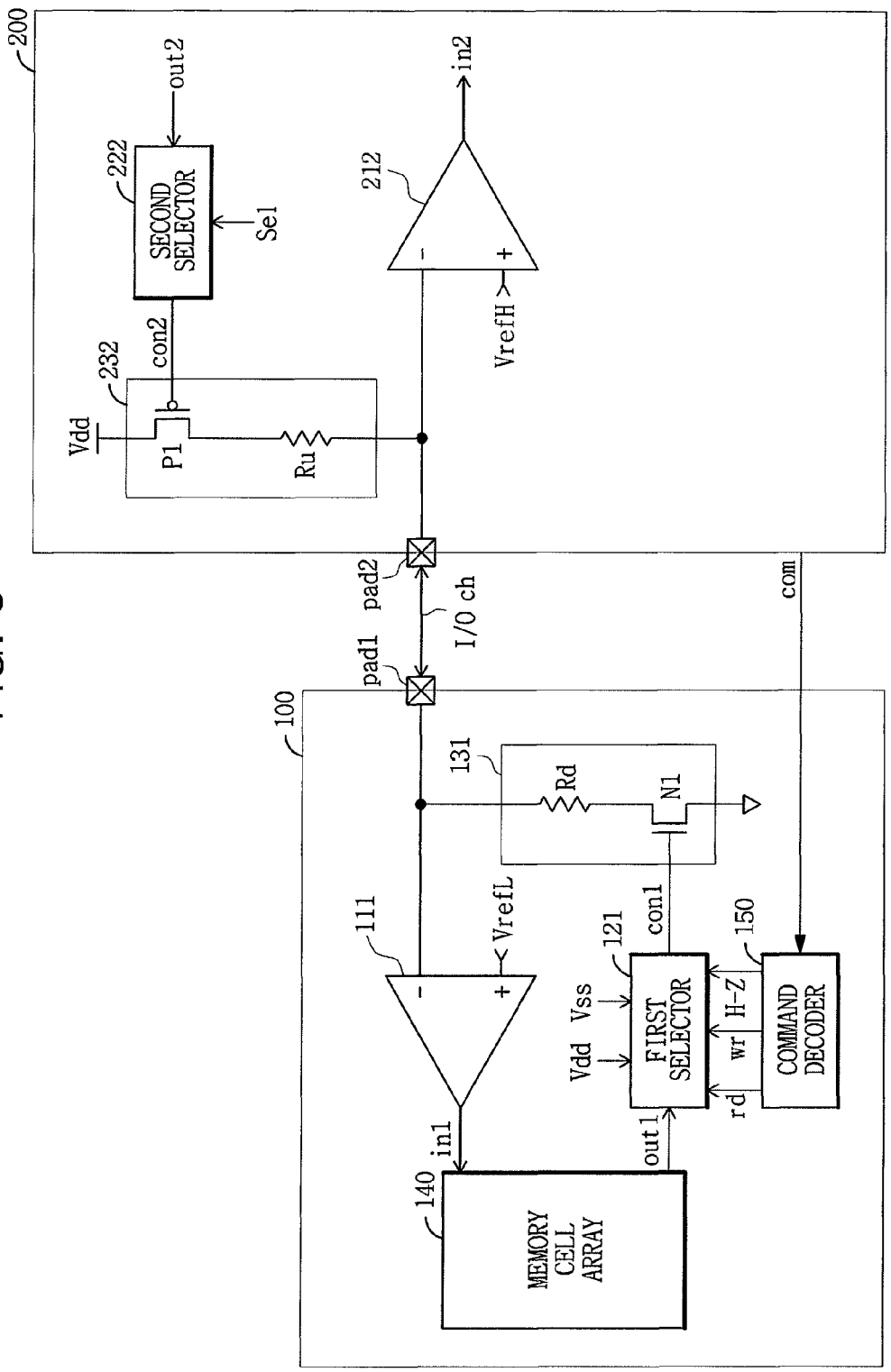
FIG. 3 illustrates a transceiver system according to an exemplary embodiment of the inventive concept.

FIG. 3 illustrates a transceiver system according to an exemplary embodiment of the inventive concept. The transceiver system may be a memory system including a semiconductor memory device 100 and a memory controller 200. The semiconductor memory device 100 may include a first input unit 111, a first selector 121, a first terminator/driver 131, a first I/O pad pad1, a memory cell array 140, and a command decoder 150. The memory controller 200 may include a second input unit 212, a second selector 222, a second terminator/driver 232, and a second I/O pad pad2.

Although FIG. 3 shows each of the semiconductor memory device 100 and the memory controller 200 having one I/O circuit including the input unit 111 or 212, the selector 121 or 222, and the terminator/driver 131 or 232, they each may have a plurality of I/O circuits. Further, although FIG. 3 shows the I/O circuits of the semiconductor memory device 100 and the memory controller 200 inputting and outputting data to and from the memory cell array 140, they may be used to input and output a command signal com and an address signal.

In FIG. 3, a first reference voltage VrefL input to the input unit 111 of the I/O circuit, which has the terminator/driver 131 including a pull-down circuit, has a lower level than a second reference voltage VrefH input to the input unit 212 of the I/O circuit, which has the terminator/driver 232 including a pull-up circuit. Further, the second reference voltage VrefH has a lower level than a supply voltage, and the first reference voltage VrefL has a higher level than the ground voltage.

The semiconductor memory device 100 stores an input data signal in the memory cell array 140 or outputs data stored in the memory cell array 140 in response to the command signal com input from the memory controller 200.

Functions of the first input unit 111 and the first terminator/driver 131 are the same as those of the input unit 11 and the terminator/driver 31 described with reference to FIG. 1.

The first selector 121 selects one of a first output signal out1, a supply voltage Vdd, and a ground voltage Vss in response to a read signal rd, a write signal wr, and a high-impedance signal H-Z input from the command decoder 150, and outputs a first control signal con1. For example, the first selector 121 may output the first output signal out1, which is output from the memory cell array 140, as the first control signal con1 when the read signal rd is activated, output the first control signal con1 having the level of the supply voltage Vdd (e.g., a high level) when the write signal wr is activated, and output the first control signal con1 having the level of the ground voltage Vss (e.g., a low level) when the high-impedance signal H-Z is activated. Activation of the read signal rd, write signal wr, or high-impedance signal H-Z may refer to transitioning the signals from one logic level to another different logic level (e.g., from a logic 0 to a logic 1 or vice versa).

The command decoder 150 decodes the command signal com input from the memory controller 200 and outputs the read signal rd, the write signal wr, and the high-impedance signal H-Z. For example, the command decoder 150 may decode the command signal com and activate the read signal rd during a read operation, decode the command signal com and activate the write signal wr during a write operation, and activate the high-impedance signal H-Z when the first I/O pad pad1 of the semiconductor memory device 100 needs to be in a high-impedance state, such as during a refresh operation.

The memory controller 200 outputs the command signal com to the semiconductor memory device 100 and writes or reads data to or from the memory cell array 140 of the semiconductor memory device 100. Functions of the second input unit 212, the second selector 222, and the second terminator/driver 232 are the same as those of the input unit 12, the selector 22, and the terminator/driver 32 described with reference to FIG. 2.

Figure 4A:
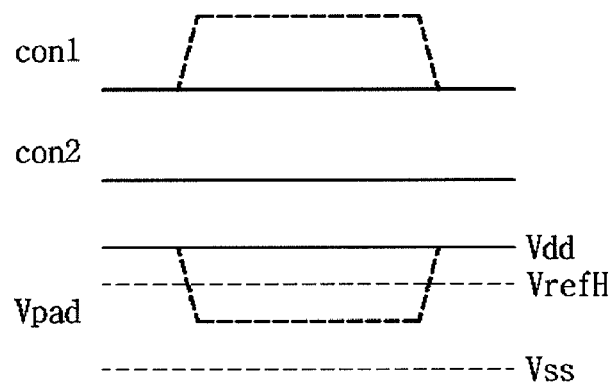
FIGS. 4A and 4B illustrate exemplary operations of the transceiver system shown in FIG. 3 according to an exemplary embodiment of the inventive concept.
Figure 4B:
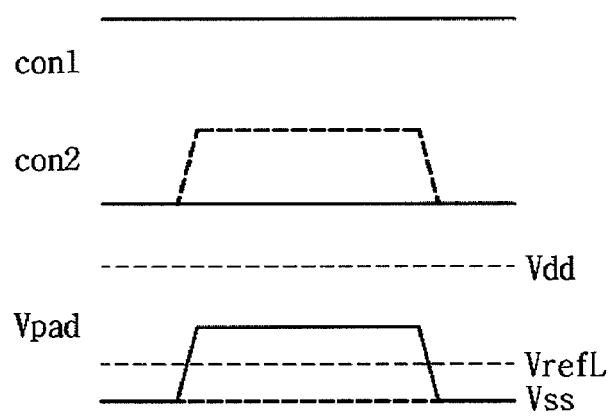

FIGS. 4A and 4B illustrate exemplary operations of the transceiver system shown in FIG. 3 according to an exemplary embodiment of the inventive concept. For example, FIG. 4A illustrates a read operation, and FIG. 4B illustrates a write operation. In FIGS. 4A and 4B, solid lines denote an example in which data of logic "0" is read or written, and dotted lines denote an example in which data of logic "1" is read or written.

Referring to FIG. 4A, during the read operation (e.g., when the semiconductor memory device 100 transmits data and the memory controller 200 receives the data), the second selector 222 outputs a second control signal con2 of a low level in response to the selection signal Sel. Thus, the second I/O pad pad2 is terminated with the level of the supply voltage Vdd.

During the read operation, the command decoder 150 decodes the command signal com input from the memory controller 200 and activates the read signal rd, and the first selector 121 outputs the first output signal out1, which is data output from the memory cell array 140, as the first control signal con1 in response to the read signal rd. When the first output signal out1 output from the memory cell array 140 is a logic "0," the first selector 121 outputs the first control signal con1 of a low level. Thus, a pull-down NMOS transistor N1 of the first terminator/driver 131 is turned off, and the voltages of the first I/O pad pad1 and the I/O channel I/O ch connected with the first I/O pad pad1 are maintained at the level of a termination voltage (i.e., the level of the supply voltage Vdd).

As a result, the voltage of the second I/O pad pad2 is also maintained at the level of the supply voltage Vdd, and the second input unit 212 outputs a second input signal in2 of a low level because the voltage of the second I/O pad pad2 is higher than the level of the second reference voltage VrefH. When the first output signal out1 output from the memory cell array 140 is a logic "1," the first selector 121 outputs the first control signal con1 of a high level. Thus, the pull-down NMOS transistor N1 of the first terminator/driver 131 is turned on, and the voltages of the first I/O pad pad1 and the I/O channel I/O ch connected with the first I/O pad pads decrease. As a result, the voltage of the second I/O pad pad2 becomes lower than the second reference voltage VrefH, and the second input unit 212 outputs the second input signal in2 of a high level.

Referring to FIG. 4B, during the write operation (i.e., when the memory controller 200 transmits data and the semiconductor memory device 100 receives the data), the command decoder 150 decodes the command com output from the memory controller 200 and activates the write signal wr, and the first selector 121 outputs the first control signal con1 of high level in response to the write signal wr. Thus, the first I/O pad pad1 is terminated with the level of the ground voltage Vss.

During the write operation, the second selector 222 outputs a second output signal out2, which is data to be written in the memory cell array 140 of the semiconductor memory device 100, as the second control signal con2 in response to the selection signal Sel. When the second output signal out2 is a logic "0," the second selector 222 outputs the second control signal con2 of a low level. Thus, a pull-up PMOS transistor P1 of the second terminator/driver 232 is turned on, and the voltages of the second I/O pad pad2 and the I/O channel I/O ch connected with the second I/O pad pad2 increase. As a result, the voltage of the first I/O pad pad1 has a higher level than the first reference voltage VrefL, and the first input unit 111 outputs a first input signal in1 of a low level. When the second output signal out2 is a logic "1," the second selector 222 outputs the second control signal con2 of a high level. Thus, the pull-up PMOS transistor P1 of the second terminator/driver 232 is turned off, and the voltages of the second I/O pad pad2 and the I/O channel I/O ch connected with the second I/O pad pad2 are maintained at the level of the termination voltage (i.e., the level of the ground voltage Vss). As a result, the voltage of the first I/O pad pad1 is maintained at a lower level than the first reference voltage VrefL, and the first input unit 111 outputs the first input signal in1 of a high level.

Figure 5:
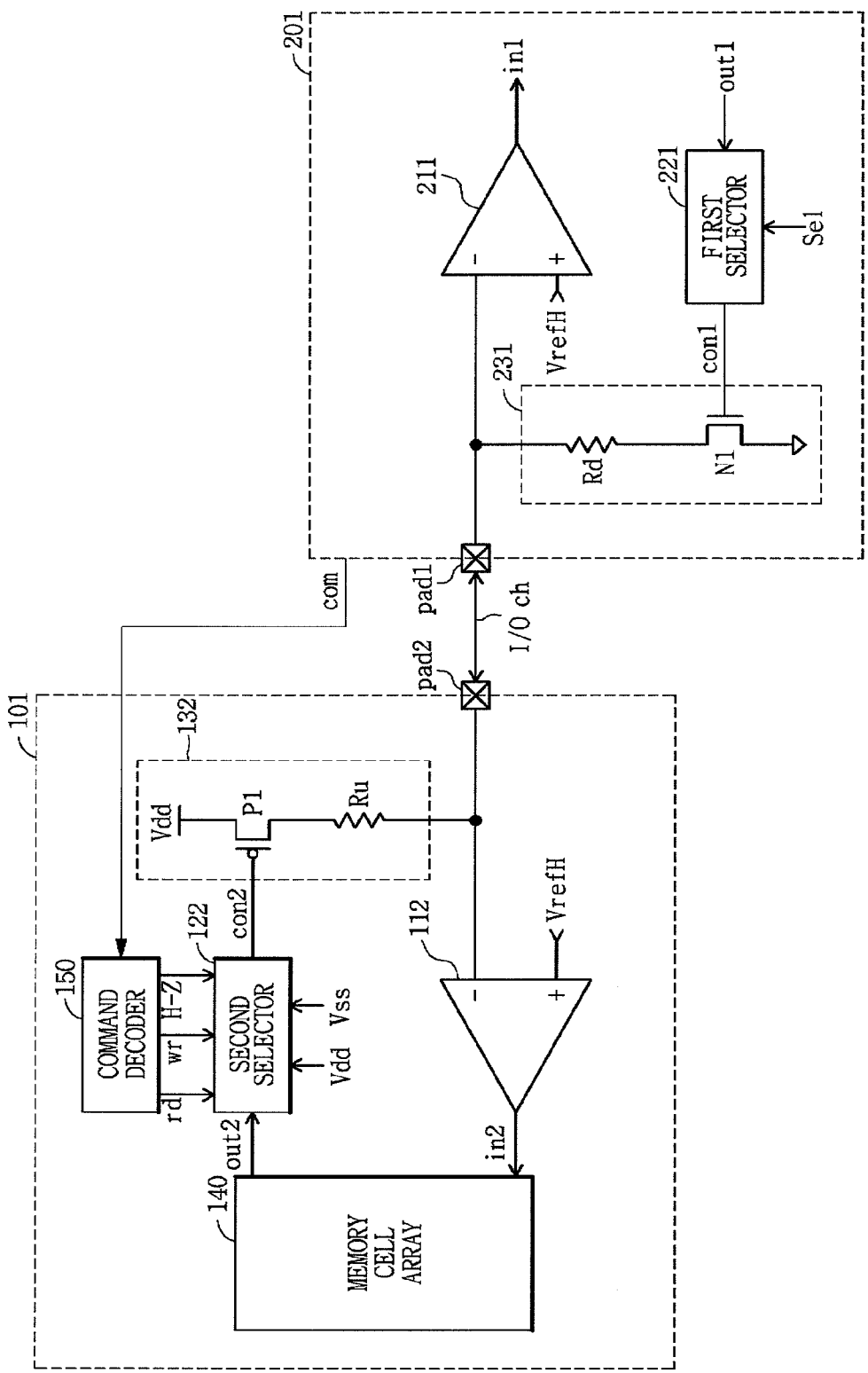
FIG. 5 illustrates a transceiver system according to an exemplary embodiment of the inventive concept.

FIG. 5 illustrates a transceiver system according to an exemplary embodiment of the inventive concept, which includes a semiconductor memory device 101 and a memory controller 201. The semiconductor memory device 101 may include a second input unit 112, a second selector 122, a second terminator/driver 132, a memory cell array 140, and a command decoder 150. The memory controller 201 may include a first input unit 211, a first selector 221, and a first terminator/driver 231.

Each of the semiconductor memory device 101 and the memory controller 201 may include a plurality of I/O circuits having an input unit, a selector, and a terminator/driver, and the I/O circuits may be used to transceive a command signal and/or an address signal as well as a data signal. Also, a second reference voltage VrefH input to the second input unit 112 has a higher level than a first reference voltage VrefL input to the first input unit 211. Further, the first reference voltage VrefL has a higher level than a ground voltage Vss, and the second reference voltage VrefH has a lower level than a supply voltage Vdd.

Functions of the semiconductor memory device 101 and the memory controller 201 are the same as those of the semiconductor memory device 100 and the memory controller 200 described with reference to FIG. 3, and functions of the memory cell array 140 and the command decoder 150 are the same as described with reference to FIG. 3. Also, functions of the second terminator/driver 132 and the second input unit 112 are the same as those of the terminator/driver 32 and the input unit 12 described with reference to FIG. 2, and functions of the first terminator/driver 231 and the first input unit 211 are the same as those of the terminator/driver 31 and the input unit 11 described with reference to FIG. 1.

The second selector 122 selects one of a second output signal out2, the supply voltage Vdd, and the ground voltage Vss in response to a read signal rd, a write signal wr, and a high-impedance signal H-Z input from the command decoder 150, and outputs the selected signal as a second control signal con2. For example, the second selector 122 may output the second output signal out2, which is output from the memory cell array 140, as the second control signal con2 when the read signal rd is activated, output the second control signal con2 having the level of the ground voltage Vss (e.g., a low level) when the write signal wr is activated, and output the second control signal con2 having the level of the supply voltage Vdd (e.g., a high level) when the high-impedance signal H-Z is activated.

Figure 6A:
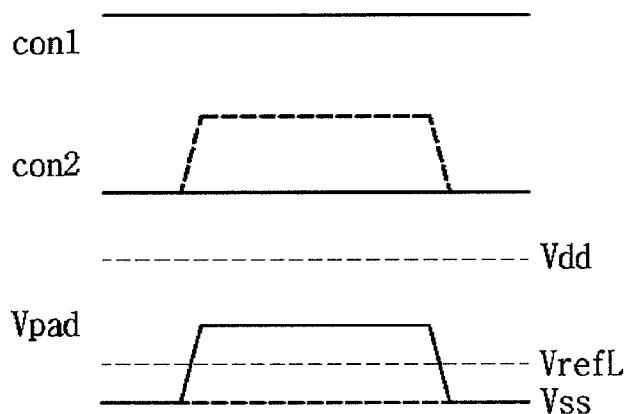
FIGS. 6A and 6B illustrate exemplary operations of the transceiver system shown in FIG. 5 according to an exemplary embodiment of the inventive concept.
Figure 6B:
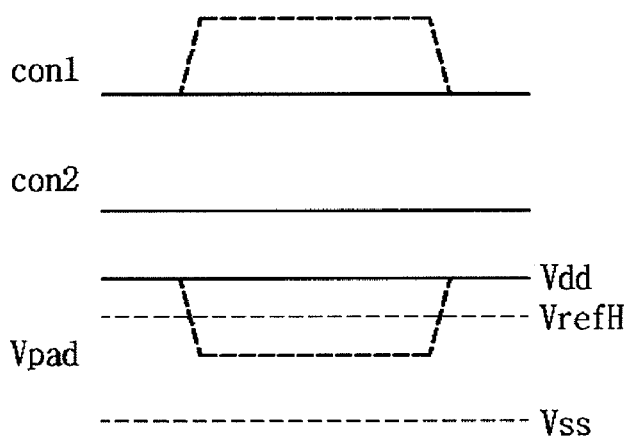

FIGS. 6A and 6B illustrate exemplary operations of the transceiver system shown in FIG. 5 according to an exemplary embodiment of the inventive concept. For example, FIG. 6A illustrates a read operation, and FIG. 6B illustrates a write operation. In FIGS. 6A and 6B, solid lines denote an example in which data of a logic "0" is read or written, and dotted lines denote an example in which data of a logic "1" is read or written.

Referring to FIG. 6A, during the read operation (i.e., when the semiconductor memory device 101 transmits data and the memory controller 201 receives the data), the first selector 221 outputs a first control signal con1 in response to a selection signal Sel. Thus, a first I/O pad pad1 is terminated with the level of the ground voltage Vss.

During the read operation, the command decoder 150 decodes a command signal com input from the memory controller 201 and activates the read signal rd, and the second selector 122 outputs the second output signal out2, which is data output from the memory cell array 140, as the second control signal con2 in response to the read signal rd. When the second output signal out2 output from the memory cell array 140 is a logic "0," the second selector 122 outputs the second control signal con2 of a low level. Thus, a pull-up PMOS transistor P1 of the second terminator/driver 132 is turned on, and the voltages of a second I/O pad pad2 and an I/O channel I/O ch connected with the second I/O pad pad2 increase. As a result, the voltage of the first I/O pad pad1 has a higher level than the first reference voltage VrefL, and the first input unit 211 outputs a first input signal in1 of a low level. When the second output signal out2 output from the memory cell array 140 is a logic "1," the second selector 122 outputs the second control signal con2 of a high level. Thus, the pull-up PMOS transistor P1 of the second terminator/driver 132 is turned off, and the voltages of the second I/O pad pad2 and the I/O channel I/O ch connected with the second I/O pad pad2 are maintained at the level of a termination voltage (i.e., the level of the ground voltage Vss). As a result, the voltage of the first I/O pad pad1 is maintained at a lower level than the first reference voltage VrefL, and the first input unit 211 outputs the first input signal in1 of a high level.

Referring to FIG. 6B, during the write operation (i.e., when the memory controller 201 transmits data and the semiconductor memory device 101 receives the data), the command decoder 150 decodes the command com output from the memory controller 201 and activates the write signal wr, and the second selector 122 outputs the second control signal con2 of low level in response to the write signal wr. Thus, the second I/O pad pad2 is terminated with the level of the supply voltage Vdd.

During the write operation, the first selector 221 outputs a first output signal out1, which is data to be written in the memory cell array 140 of the semiconductor memory device 101, as the first control signal con1 in response to the selection signal sel. When the first output signal outs is a logic "0," the first selector 221 outputs the first control signal con 1 of a low level. Thus, a pull-down NMOS transistor N1 of the first terminator/driver 231 is turned off, and the voltages of the first I/O pad pad1 and the I/O channel I/O ch connected with the first I/O pad pads are maintained at the level of the termination voltage (i.e., the level of the supply voltage Vss). As a result, the voltage of the second I/O pad pad2 is maintained at a higher level than the second reference voltage VrefH, and the second input unit 112 outputs a second input signal in2 of a low level. When the first output signal out 1 is a logic "1," the first selector 221 outputs the first control signal con1 of a high level. Thus, the pull-down NMOS transistor N1 of the first terminator/driver 231 is turned on, and the voltages of the first I/O pad pad1 and the I/O channel I/O ch connected with the first I/O pad pad1 decrease. As a result, the voltage of the second I/O pad pad2 decreases to have a lower level than the second reference voltage VrefH, and the second input unit 112 outputs the second input signal in2 of a high level.

In the description above, the exemplary embodiments of the transceiver systems of FIGS. 3 and 5 are memory systems, but the inventive concept can be applied to transceiver systems of general semiconductor devices. Also, although the terminator/driver 131, 132, 231 or 232 is shown as being connected between a data I/O pad pad and a supply voltage Vdd or the ground voltage, it can be connected between the data I/O pad pad and a predetermined voltage other than the supply voltage Vdd or the ground voltage.

In a transceiver system according to at least one exemplary embodiment of the inventive concept, and a semiconductor device and a data transceiving method of the system, only one of a pull-up circuit and pull-down circuit capable of bidirectional communication is selectively prepared to reduce not only an input capacitance component but also power consumption and a layout area.

The foregoing is illustrative of example embodiments and is not to be construed as limiting thereof. Having described exemplary embodiments of the inventive concept, those skilled in the art will readily appreciate that many modifications can be made in the exemplary embodiments without departing from the disclosure. Accordingly, all such modifications are intended to be included within the scope of the disclosure.

What is claimed is:

1. A transceiver system, comprising:
    a first semiconductor device having a first input/output (I/O) pad connected with an I/O channel, and including a first terminator/driver configured to terminate the first I/O pad with a first voltage when data is received, and maintain the first I/O pad and the I/O channel at the first voltage when data is transmitted; and
    a second semiconductor device having a second I/O pad connected with the I/O channel, and configured to terminate the second I/O pad with a second voltage higher than the first voltage when data is received, and maintain the second I/O pad and the I/O channel at the second voltage when data is transmitted, wherein the first semiconductor device includes a decoder/selector configured to output a control signal to the first terminator/driver in response to an externally input command signal during a read operation, and output the control signal to the first terminator/driver in response to an output signal of a memory cell array during a write operation.

2. The transceiver system according to claim 1, wherein the first semiconductor device is configured to compare a first reference voltage higher than the first voltage with a voltage of the first I/O pad, and the second semiconductor device is configured to compare a second reference voltage higher than the first voltage and lower than the second voltage with a voltage of the second I/O pad.

3. The transceiver system according to claim 2, wherein the first semiconductor device comprises:

the first terminator/driver connected between the first I/O pad and the first voltage, and configured to terminate the first I/O pad with the first voltage when the first semiconductor device receives data, and maintain the first I/O pad and the I/O channel at the first voltage when the first semiconductor device transmits data; and a first input unit configured to compare the first reference voltage with the voltage of the first I/O pad and output a first input signal when the first semiconductor device receives data.

4. The transceiver system according to claim 3, wherein the second semiconductor device comprises:

a second terminator/driver connected between the second I/O pad and the second voltage, and configured to terminate the second I/O pad with the second voltage when the second semiconductor device receives data, and drive the second I/O pad and the I/O channel using the second voltage when the second semiconductor device transmits data; and a second input unit configured to compare the second reference voltage with the voltage of the second I/O pad and output a second input signal when the second semiconductor device receives data.

5. The transceiver system according to claim 4, wherein the first semiconductor device further comprises:

a memory cell array configured to receive and store the first input signal during the write operation, and output the output signal during the read operation, wherein the decoder/selector outputs the control signal at a high level in response to the externally input command signal during the read operation, and outputs the control signal in response to the output signal during the write operation, wherein the first terminator/driver terminates the first I/O pad with the first voltage in response to the control signal during the read operation and drives the first I/O pad and the I/O channel in response to the control signal during the write operation, and wherein the first semiconductor device is a semiconductor memory device and the second semiconductor device is a memory controller that outputs the command signal.

6. The transceiver system according to claim 5, wherein the first terminator/driver comprises:

an n-type metal oxide semiconductor (NMOS) transistor connected with the first voltage and having a gate to which the control signal is applied; and a pull-down resistor connected between the NMOS transistor and the first I/O pad.

7. The transceiver system according to claim 5, wherein the decoder/selector outputs the control signal at a low level in response to the command signal during a refresh operation, and the first terminator/driver sets the first I/O pad to a high-impedance state in response to the control signal during the refresh operation.

8. The transceiver system according to claim 4, wherein the second semiconductor device further comprises:

a memory cell array configured to receive and store the second input signal during a write operation, and output an output signal during a read operation; and a decoder/selector configured to output a control signal of a low level in response to an externally input command signal during the read operation, and output the control signal in response to the output signal during the write operation, wherein the second terminator/driver terminates the second I/O pad with the second voltage in response to the control signal during the read operation and drives the second I/O pad and the I/O channel in response to the control signal during the write operation, and wherein the second semiconductor device is a semiconductor memory device and the first semiconductor device is a memory controller that outputs the command signal.

9. The transceiver system according to claim 8, wherein the second terminator/driver comprises:

a p-type metal oxide semiconductor (PMOS) transistor connected with the second voltage and having a gate to which the control signal is applied; and a pull-up resistor connected between the PMOS transistor and the second I/O pad.

10. The transceiver system according to claim 8, wherein the decoder/selector outputs the control signal of a high level in response to the command signal during a refresh operation, and the second terminator/driver sets the second I/O pad to a high-impedance state in response to the control signal during the refresh operation.

11. A semiconductor device, comprising:

an input/output (I/O) pad connected with an I/O channel;

a terminator/driver connected between the I/O pad and a ground voltage, and configured to terminate the I/O pad with the ground voltage when data is received;

an input unit configured to compare a voltage of the I/O pad with a reference voltage higher than the ground voltage and output an input signal when the data is received; and a decoder/selector configured to output a control signal at a first logic level to the terminator/driver in response to an externally input command signal during a read operation, output the control signal at a second logic level to the terminator/driver during a refresh operation, and output the control signal to the terminator/driver in response to an output signal of a memory cell array during a write operation.

12. The semiconductor device according to claim 11, wherein the terminator/driver maintains the I/O pad and the I/O channel at the ground voltage when data is transmitted.

13. The semiconductor device according to claim 12, wherein the semiconductor device is a semiconductor memory device further including:

the memory cell array configured to receive and store the input signal during the write operation, and output the output signal during the read operation; and wherein the terminator/driver comprises:

an n-type metal oxide semiconductor (NMOS) transistor connected with the ground voltage and to which the control signal is applied; and
a pull-down resistor connected between the NMOS transistor and the I/O pad,
wherein the first logic level is a high level and the second logic level is a low level.

14. A semiconductor device, comprising:
an input/output (I/O) pad connected with an I/O channel;
a terminator/driver connected between the I/O pad and a supply voltage, and configured to terminate the I/O pad with the supply voltage when data is received; and
an input unit configured to compare a voltage of the I/O pad with a reference voltage lower than the supply voltage and output an input signal when data is received;
a memory cell array configured to receive and store the input signal during a write operation, and output an output signal during a read operation; and
a decoder/selector configured to output a control signal of a first logic level to the terminator/driver in response to an externally input command signal during the read operation, output the control signal of a second logic level to the terminator/driver during a refresh operation, and output the control signal to the terminator/driver in response to the output signal during the write operation.

15. The semiconductor device according to claim 14, wherein the terminator/driver maintains the I/O pad and the I/O channel at the supply voltage when data is transmitted.

16. The semiconductor device according to claim 15, wherein the terminator/driver comprises:
a p-type metal oxide semiconductor (PMOS) transistor connected with the supply voltage and to which the control signal is applied; and
a pull-up resistor connected between the PMOS transistor and the I/O pad,
wherein the first logic level is a low level and the second logic level is a high level.

17. A data transceiving method of a semiconductor device including a first semiconductor device having a first input/output (I/O) pad connected with an I/O channel, and a second semiconductor device having a second I/O pad connected with the I/O channel, the method comprising:
terminating, by the first semiconductor device, the first I/O pad with a first voltage when the second semiconductor device transmits data to the first semiconductor device;
terminating, by the second semiconductor device, the second I/O pad with a second voltage higher than the first voltage when the first semiconductor device transmits data to the second semiconductor device;
maintaining, by the second semiconductor device, the second I/O pad and the I/O channel at the second voltage when the second semiconductor device transmits data to the first semiconductor device; and
maintaining, by the first semiconductor device, the first I/O pad and the I/O channel using the first voltage when the first semiconductor device transmits data to the second semiconductor device,
wherein the terminating by the first semiconductor device comprises outputting one of a signal of a first logic level, a signal of a second logic level, or an output of a memory array cell as a control signal to a terminator/driver of the first semiconductor device based on receipt of one of a read signal, a write signal, and a high impedance signal.

18. The data transceiving method according to claim 17, further comprising:
comparing, by the first semiconductor device, a first reference voltage higher than the first voltage with a voltage of the first I/O pad;
generating, by the first semiconductor device, a first input signal when the second semiconductor device transmits data to the first semiconductor device;
comparing, by the second semiconductor device, a second reference voltage higher than the first reference voltage and lower than the second voltage with a voltage of the second I/O pad; and
generating, by the second semiconductor device, a second input signal when the first semiconductor device transmits data to the second semiconductor device.

19. The data transceiving method according to claim 18, wherein the first semiconductor device is a semiconductor memory device, and the second semiconductor device is a memory controller.

20. The data transceiving method according to claim 18, wherein the first semiconductor device is a memory controller, and the second semiconductor device is a semiconductor memory device.

21. The data transceiving method according to claim 18, further comprising setting one of the first I/O pad or the second I/O pad to a high-impedance state.

* * * * *